United States Patent [19]

Weber

[11] Patent Number: 4,518,848

[45] Date of Patent: May 21, 1985

[54] APPARATUS FOR BAKING RESIST ON SEMICONDUCTOR WAFERS

[75] Inventor: T. Jerome Weber, Mt. View, Calif.

[73] Assignee: GCA Corporation, Bedford, Mass.

[21] Appl. No.: 263,928

[22] Filed: May 15, 1981

[51] Int. Cl.³ .......................... F27B 9/06; F27D 11/02
[52] U.S. Cl. .................................. 219/388; 219/462; 219/460; 432/11; 432/121
[58] Field of Search .............. 219/388, 400, 460, 462; 34/203; 165/65; 99/443 C; 430/311; 118/59, 62; 432/11, 124, 121, 235; 302/29, 30, 31

[56] References Cited

U.S. PATENT DOCUMENTS 3,870,460  3/1975  Flint ........................................ 432/11
3,947,236  3/1976  Lasch, Jr. ............................. 432/11

OTHER PUBLICATIONS

Boomhower et al., *IBM Technical Disclosure Bulletin*, "Heated Base Airtrack Tool System for Heated Media or Reactive Wafer Transport/Processing", pp. 2946-2948, vol. 19, No. 8, Jan. 1977, 219-388.

*Primary Examiner*—Volodymyr Y. Mayewsky
*Attorney, Agent, or Firm*—Kenway & Jenney

[57] ABSTRACT

In the resist baking apparatus disclosed herein, heating of the wafer is effected by direct contact with a thin disc-like heating plate whose heat capacity is not greatly disparate from that of the wafer. The heating plate is initially brought to a temperature higher than that which is to be applied to the resist but the corresponding cooling of the plate as the wafer is initially heated prevents damaging temperatures from reaching the resist. The heater plate is perforate and air pressure is utilized to support a wafer over the heater plate before heating is to begin and also to later lift the wafer and thereby sharply define the end of heating. During baking, a vacuum is applied through these same perforations to clamp the wafer tightly against the heating plate for tight thermal coupling.

10 Claims, 5 Drawing Figures

APPARATUS FOR BAKING RESIST ON SEMICONDUCTOR WAFERS

BACKGROUND OF THE INVENTION

The present invention relates to the manufacture of semiconductor devices and more particularly to the baking of photosensitive resists used for forming patterns on the faces of semiconductor wafers.

The baking of photosensitive resist coatings on semiconductor wafers has heretofore been performed in essentially conventional oven structures. For example, wafers are either inserted in a batch convection oven or have been carried on a flexible band through a tunnel oven where the wafers have been gradually heated by the ambient temperature in the oven. During the baking, solvents are driven off from the resist and the resist is cured. As the resist typically cures from the outside in, the baking must occur relatively slowly. Otherwise, "skinning" can occur, i.e. when the outer surface cures or dries with underlying resist being uncured. As is understood by those skilled in the art, this can lead to so-called "pinholing" where small holes are formed in the resist coating by the escape of entrapped heat-generated gases.

As a result of the above-identified problems, conventional wisdom in the semiconductor art has held that a typical photoresist must be cured at a modest temperature (85°–95° C.) and for relatively long times (3–30 minutes). As a consequence, the oven structures typically employed in semiconductor manufacturing systems have been relatively large since they must hold the wafers for a significant amount of time and, given the rate at which other processes can proceed, a relatively large number of wafers will be undergoing baking at any one time. As is also understood by those skilled in the art, this large size or volume imposes a significant economic floorspace penalty in the context of "clean room" operations such as are required for semiconductor manufacture.

Among the several objects of the present invention may be noted the provision of apparatus for quickly baking photosensitive resist on semiconductor wafers; the provision of such apparatus which requires relatively small space in a semiconcuctor manufacturing line; the provision of such apparatus which effects a uniform cure of the photoresist; the provision of such apparatus which effects curing without skinning or pinholing; the provision of such apparatus which is highly reliable and which is of relatively simple and inexpensive construction. Other objects and features will be in part apparent and in part pointed out hereinafter.

SUMMARY OF THE INVENTION

Briefly, apparatus according to the present invention effects baking of photosensitive resist on the upper surface of a semiconductor wafer at a fixed heating station to which the wafer is transported, preferably by air track means, the wafer being stopped during baking. The apparatus utilizes a thin disc-like heater plate having a diameter equal to or larger than that of the wafer to be baked. The heat capacity of the plate is essentially uniform over its surface and not greatly disparate from that of the wafer to be baked. The heater plate includes a resistive heating element which is distributed over the plate area so as to effect essentially uniform heating thereof. A plurality of small perforations are provided over the plate surface through which a wafer-supporting air flow may be applied. Prior to a bake cycle the heater is energized to a temperature above that at which the resist is to be baked. An air flow is provided through the apertures as a wafer enters the heating station so as to float the wafer over the heater plate. The air pressure is then dropped to allow the wafer to come into direct contact with the plate for a preselectable time during which a predetermined heating impulse is provided, through the wafer, to the resist.

Due to its limited heat capacity, the heating plate is cooled as the wafer is heated so that the resist does not reach the initial temperature of the heater plate. Further, since heating is accomplished from the underside of the resist, skinning and pinholing are minimized.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
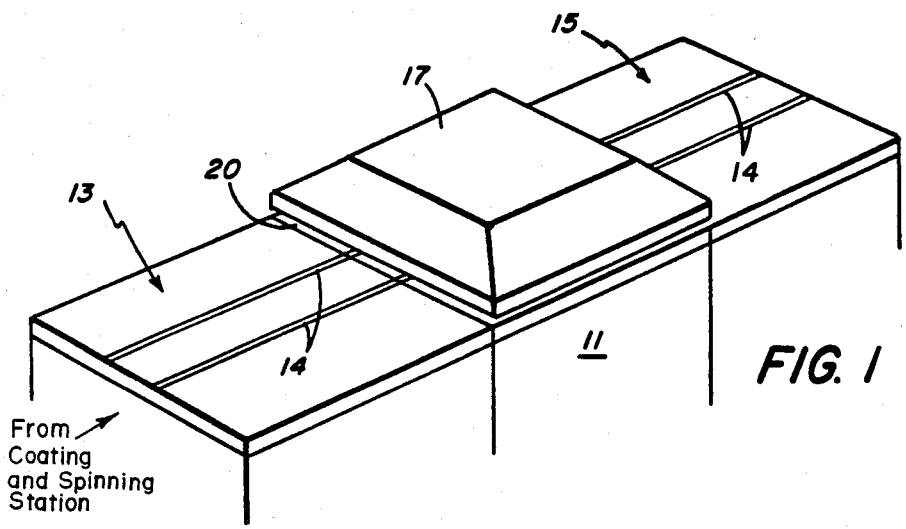
FIG. 1 is a perspective view illustrating a portion of a semiconductor manufacturing line including a heating station constructed in accordance with the present invention and utilizing an air track wafer-handling system.

Referring now to FIG. 1, there is illustrated there a portion of a semiconductor manufacturing line. As is understood by those skilled in the art, such lines are now preferably constructed in interconnected modular form so that successive steps in the manufacturing process are performed without intermediate manual handling of the wafers. The overall type of system illustrated is that manufactured by the Sunnyvale Division of GCA Corporation and sold under the trademark WAFERTRAC. In this system, wafers are transported from one station or process to the next on air bearing track so as to minimize damage to the wafers. It should be understood that transport outside of the module could be accomplished by other well known means if desired.

With reference to FIG. 1, a heating station in accordance with the present invention is indicated generally by reference character 11. A section of air track 13 is provided for feeding wafers to the heating station, e.g. from a coating and spinning station which applies photosensitive resist to the upper surface of the wafer. Similarly, another section of air track 15 is provided for taking heating wafers away from the baking station 11. The heating station includes a top plate 20 providing a work surface level with the incoming and outgoing air tracks. The individual air bearing tracks are indicated by reference character 14. As is understood in the art, these tracks comprise a plenum system together with a multiplicity of apertures or jets which float the wafers and prevent direct contact with the track. As is likewise understood, the jets are typically inclined so as to propel the wafers along the track as well as support them.

As is explained in greater detail hereinafter, the heating station 11 treats a single wafer at a time and performs a relatively quick baking operation so that there is no need to accumulate a substantial number of wafers within the station 11. Further, the baking is performed at a single, fixed location. Accordingly, the heating station can be relatively short as compared with previous ovens. In the WAFERTRAC modular system illustrated, the heating station can occupy a single module unit of nine inches by nine inches as compared with the prior baking ovens which required four module units, that is, they occupied a space of 9 inches by 36 inches.

The baking operation is performed on the same level as the incoming and outgoing track sections and the air tracks are continued into the heating station to deliver each wafer into alignment with a heater plate described in greater detail herein after. The heating station itself is provided with a cover 17 which can be coupled to suction means for evacuating solvent fumes driven off during the baking process.

Figure 2:
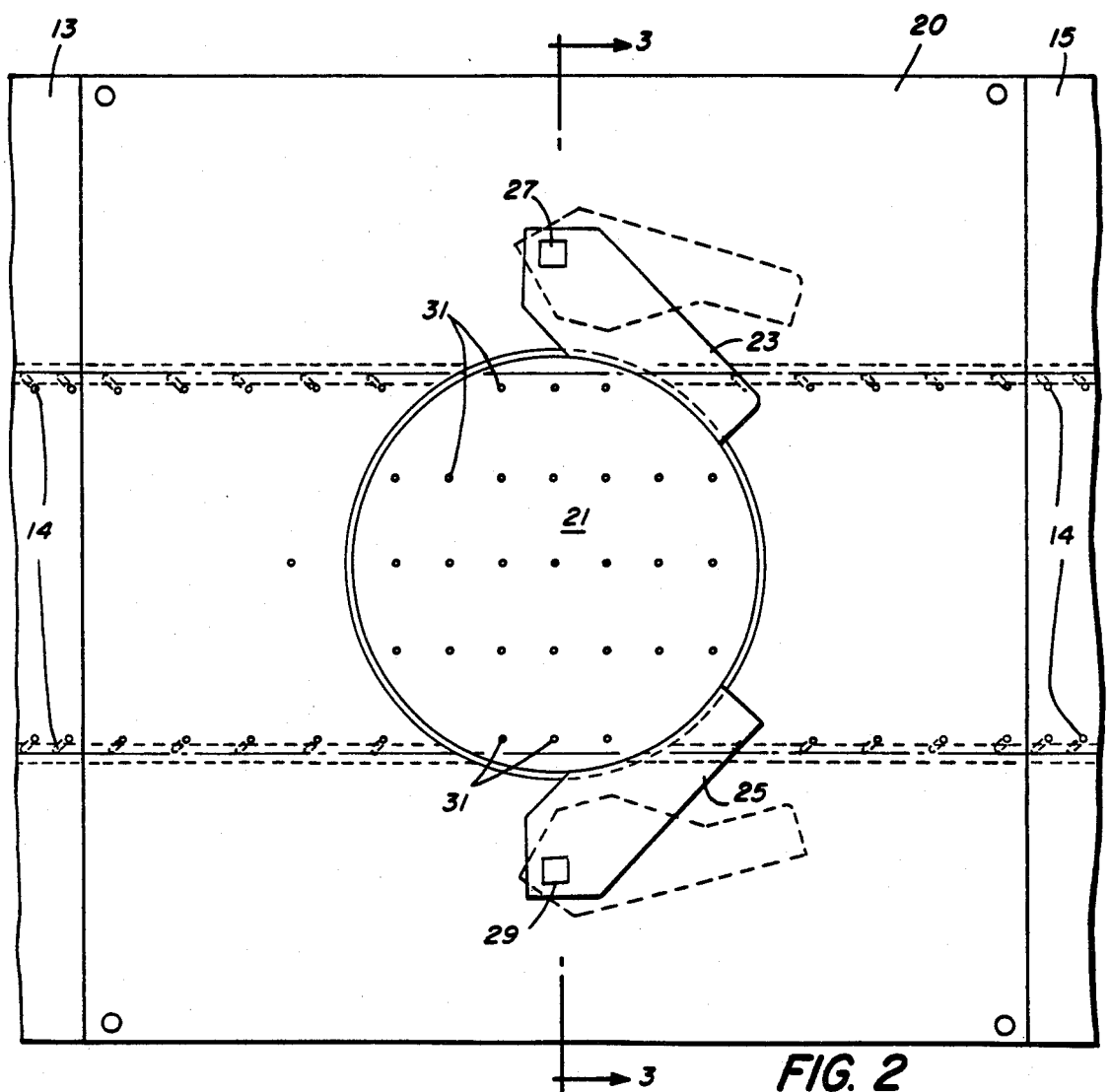
FIG. 2 is a plan view of the resist heating station employed in the apparatus of FIG. 1, with the cover removed.

FIG. 2 shows the working surface of the heating station 11 with the cover 17 removed. As may be seen, the air tracks 14 are continued into the bake station on both the input and output sides of the station. In line with the air tracks is a heater plate 21 which is set flush into the top surface of the heating station. The diameter of the heating plate 21 corresponds to the diameter of the wafers which are to be baked, e.g. the heater will be 100 millimeters or more in diameter for industry-standard 100 millimeter wafers. A pair of movable stops 23 and 25 are provided for causing a wafer being brought into the station to stop in alignment with the heater plate 21. Movable stops 23 and 25 are mounted on pivot shafts, 27 and 29 respectively. Shafts 27 and 29 are selectively rotated by a pneumatically driven linkage (not shown) so as to move the stops 23 and 25 out of the path of the wafer when baking is complete, allowing the wafer to proceed off the heater plate and on to the exit air track section 15.

In order to permit a wafer to be floated over the heater element 21, out of contact therewith, the face of the heater element is provided with a plurality of small apertures 31 which act as ports to establish an air bearing effect. To facilitate movement of the wafer when the movable stops 23 and 25 are opened, the apertures 31 are preferably also inclined to impart a forward bias to the wafer along the air track system as illustrated in FIG. 2.

In order to initiate the actual baking operation, the supply of air to the ports 31 is withdrawn and replaced with a vacuum so as to bring the wafer down into intimate contact with the heater plate 21. Prior to this time, negligible heating of the wafer occurs due to the insulating effect of the intervening air film. Likewise, upon completion of the baking, the reapplication of air pressure in place of the vacuum causes the wafer to lift, terminating the heating essentially immediately, even before the wafer begins to move down the air track. In this way the initiation and termination of heating occurs essentially simultaneously over the entire area of the wafer and rather than being applied progressively which would be the case if significant heating occurred as would be the case if significant heat were transferred while the wafer were progressively overlying the heater plate.

Figure 3:
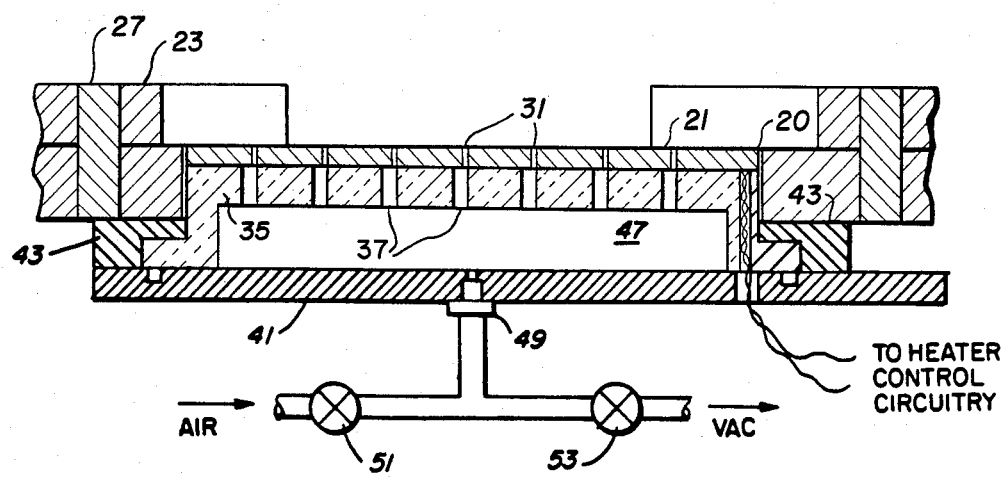
FIG. 3 is a cross-sectional view of the heating station showing the construction of a heater plate employed in the station of FIG. 2 with the section being taken substantially on the line 3—3 of FIG. 2, the section not showing the stops which are shown positioned adjacent to the heating station in FIG. 2.

As illustrated in FIG. 3, the heater plate 21 is set into and flush with the work station top plate 20 but is not in direct contact therewith. Preferably, as illustrated, there is a small annular gap between the two elements so that a significant temperature differential can exist without major heat loss from the rim of the heater plate. The heater plate 21 is mounted on a support 35 which is preferably constructed of a thermally insulated material such as silica. In this way, the thermal behavior of the top plate is defined mostly by its own characteristics and is minimally influenced by the support. Support 35 is provided with a plurality of apertures 37 which align with the apertures 31 in the heater plate 21. The heater plate support 35 is in turn held to a base plate 41 by an annular clamp 43. Support 35 provides a plenum chamber 47. Through a port 49, either clean air under pressure or a vacuum may be applied, through respective control valves 51 and 53.

Figure 4:
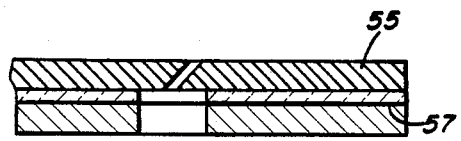
FIG. 4 is a sectional view illustrating further detail in the construction of the heater plate.
Figure 5:
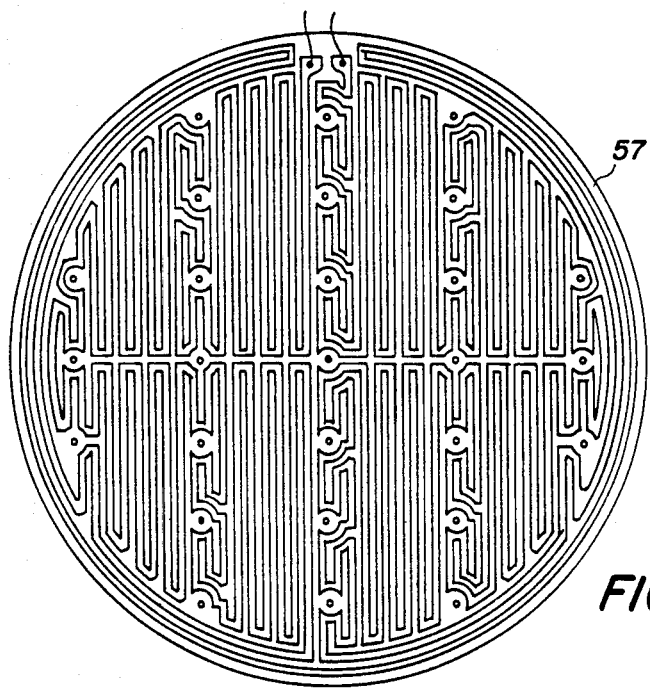
FIG. 5 is a bottom view of the heater plate showing the heater arrangement.

As illustrated in FIG. 4, the heater plate 21 comprises a thin circular disc of aluminum or nickel-plated copper, together with a resistive heater element 57. Heater element 57 is of the type comprising a resistive foil 57a and insulating substrate 57b, the foil being etched away in a convoluted pattern meandering over the surface to be heated thereby to effect essentially uniform heating thereof. This pattern is illustrated in FIG. 5. Such heaters are available from several sources including Minco Products Inc., 7300 Commerce Lane, Minneapolis, Minnesota and Electro-Flex Heat Inc., Northwood Industrial Park, Bloomfield, Connecticut.

In a presently preferred embodiment, a nichrome foil bonded to a thin sheet of kapton is etched away in the desired pattern. This heater is then bonded to the heater plate 55 with the Kapton film forming an insulator between the foil and the heater plate 55. Suitable wire leads are attached to the ends of the resistive element and led down through an aperture in the heater. For high temperature operation, it is contemplated that a foil could be applied to and selectively etched away from the silica support itself. Preferably, a thermocouple (not shown) is also mounted in between the heater and the heater plate for effecting a temperature measurement. The leads for the thermocouple are also led out with the heater energizing wires and used to provide a feedback signal so that a servo type of temperature control can be obtained.

To perform a baking cycle, the heater plate 21 is initially brought up to a temperature slightly higher than that which is to be applied to the resist. The purpose of this higher temperature is to provide a reserve of heat which can be quickly transferred to the wafer on its initial contact with the plate thereby to quickly bring it up to resist curing temperatures when the vacuum is applied to clamp the wafer to the heating plate. Because of the limited thermal capacity of the heater plate, the plate is cooled simultaneously with this initial heating of the wafer and overheating does not occur. As will be understood, some of this initial heat is dissipated by the resist itself through evaporative cooling when solvents are driven off from the resist.

In that the thermal capacity of the heater plate is limited, the initial transfer of thermal energy is dissipated relatively quickly and, at this point, power is applied to the heater to maintain a desired temperature for the bake period. Typically, this maintained temperature is appreciably lower than the initial temperature of the plate. The particular temperatures employed during each phase depend upon the nature of the resist coating and are determined empirically. Heating at this level may be maintained by the temperature control circuitry for about 5-30 seconds. At this point, the set point temperature is allowed to drop for the final stages of the cure. After a total heating cycle time of about 20-40 seconds, the vacuum valve 53 is closed and air is again admitted into the plenum 47 through the valve 51, thereby lifting the wafer from the surface of the heater plate 21. As will be understood, this film of air provides a quite effective insulation so that the baking cycle is effectively terminated at this point. Further, this termination is essentially simultaneous over the entire area of the wafer.

Once the wafer is lifted, the movable stops 23 and 25 are moved out of the path of the wafer which then, under the influence of the air coming through the apertures 31, is moved on to the air tracks 16 which transport it away from the heating station.

In that the apparatus disclosed performs a rapidly initiated bottom up baking of a resist coating on the top surface of the wafer, the entire bake cycle may be accomplished relatively quickly, e.g. one wafer every 60 seconds. This may be contrasted with the oven which this system is replacing which held each wafer for 500-1000 seconds and was working on 6-8 wafers simultaneously.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

I claim:

1. Apparatus for baking resist on the upper surface of a semiconductor wafer, said apparatus comprising:
   a heating station;
   means for transporting wafers sequentially to said heating station;
   at said heating station, a thin disc-like heater plate having a diameter essentially not smaller than that of a wafer to be baked, the heat capacity of said heater plate being essentially uniform over its surface and not greatly disparate from that of the wafers to be baked, said heater plate including a heating means which effects essentially uniform heating thereof,
   means for energizing said heater plate, prior to a bake cycle, to raise said plate to a temperature substantially above the temperature desired at which the resist is to be baked;
   selective actuable stop means in line with said transporting means for stopping a wafer in line with said plate; and
   bringing the wafers into alignment and contact with said plate for a preselectable time during which a predetermining heating impulse is provided through the wafer to resist on its upper surface, the plate being cooled as the wafer is heated, the wafer being then removed from the plate to effectively terminate the baking.

2. The apparatus as set forth in claim 1 wherein said heating means comprises a resistive heating element distributed over the under surface of said plate in a convoluted pattern to effect uniform heating of the plate.

3. The apparatus as set forth in claim 1 wherein said heating plate is perforate and wherein means are provided for selectively providing air under pressure to the backside of said plate and through said perforations so as to support and insulate a wafer being brought into alignment with the upper side of said heating plate, whereby heating can be initiated and terminated essentially uniformly over the entire wafer by dropping and then restoring the air pressure on the backside of said plate.

4. The apparatus as set forth in claim 1 further including means for selectively applying a vacuum to the backside of said plate to clamp a wafer into tight thermal contact with said heating plate.

5. Apparatus for baking resist on the upper surface of a semiconductor wafer, said apparatus comprising:
   a heating station;
   air track means for transporting wafers sequentially through said heating station;
   at said heating station, a thin disc-like heater plate having a diameter essentially not smaller than that of a wafer to be baked, the heat capacity of said heater plate being essentially uniform over its surface and not greatly disparate from that of the wafers to be baked, said heater plate including a resistive heating element which is distributed over the plate area so as to effect essentially uniform heating thereof, said plate including also a plurality of small perforations through which a wafer-supporting air flow may be applied;
   means for selectively providing air under pressure to the back side of said plate and through said small perforations thereby to float a wafer over said plate;
   selective actuable stop means in line with said air track means for stopping a wafer in alignment with said plate;
   means for energizing said air track and said air pressure providing means to propel a wafer on said track into said heating station and against said stop means and thereafter dropping the pressure of the air flow through said small perforations to lower said wafer into direct contact with said plate for a preselectable time during which a predetermining heating impulse is provided through the wafer to resist on its upper surface, the pressure being then resumed to lift the wafer and effectively terminate the baking, the stop means being thereafter open to allow the wafer to leave the heating station.

6. The apparatus as set forth in claim 5 further including means for selectively applying a vacuum to the backside of said plate thereby cutting off the air flow through said small perforations in order to clamp a wafer into tight thermal contact with said heating plate.

7. Apparatus for baking resist on the upper surface of a semiconductor wafer, said apparatus comprising:
   a heating station;
   air track means for transporting wafers sequentially to said heating station;
   at said heating station, a thin disc-like heater plate having a diameter essentially equal to that of a wafer to be baked, the heat capacity of said heater plate being essentially uniform over its surface and not greatly disparate from that of the wafers to be baked, said heater plate including a resistive heating element which is distributed over the plate area so as to effect essentially uniform heating thereof, said plate including also a plurality of small perforations through which a wafer-supporting air flow may be applied;

means for selectively providing air under pressure to the back side of said plate and through said small perforations thereby to float a wafer over said plate;

means for energizing said heater, prior to a bake cycle, to a temperature substantially above the temperature desired at which the resist is to be baked; and means for energizing said air pressure providing means to support and insulate a wafer being brought into alignment with said plate and thereafter dropping the pressure of the air flow through said small perforations in order to lower said wafer into direct contact with said plate for a reselectable time during which a predetermining heating impulse is provided through the wafer to resist on its upper surface, the pressure being then resumed to lift the wafer a distance sufficient so that the air serves as an insulator between said plate and said wafer and thereby effectively terminate the baking.

8. The apparatus as set forth in claim 7 further comprising selectively operable stop means in line with said air track means for stopping a wafer in alignment with said plate.

9. Apparatus for baking resist on the upper surface of a semiconductor wafer, said apparatus comprising:

a heating solution;

air track means for transporting wafers sequentially to said heating system;

at said heating station, a thin disc-like heater plate having a diameter essentially equal to that of a wafer to be baked, the heat capacity of said heater plate being essentially uniform over its surface and not greatly disparate from that of the wafers to be baked, said heater plate including a resistive heating element which is distributed over the plate area so as to effect essentially uniform heating thereof, said plate including also a plurality of small perforations through which a wafer-supporting air flow may be applied;

means for selectively providing air under pressure or a vacuum to the back side of said plate and through said small perforations;

means for energizing said heater plate, prior to a bake cycle, to a temperature substantially above the temperature desired at which the resist is to be baked; and means for energizing said air pressure providing means to support and insulate a wafer being brought into alignment with said plate and thereafter applying a vacuum to drop the pressure of the air flow through said small perforations thereby clamping said wafer into tight thermal contact with said plate for a preselectable time during which a predetermining heating impulse is provided through the wafer to resist on its upper surface, the plate being cooled as the wafer is heated, the air pressure being then resumed to lift the wafer and effectively terminate the baking.

10. Apparatus for baking resist on the upper surface of a semiconductor wafer, said apparatus comprising:

a heating station;

air track means for transporting wafers sequentially to said heating station;

at said heating station, a thin disc-like heater plate having a diameter essentially not smaller than that of a wafer to be baked, the heat capacity of said heater plate being essentially uniform over its surface and not greatly disparate from that of the wafers to be baked, said heater plate including a resistive heating element which is distributed over the plate area so as to effect essentially uniform heating thereof, said plate including also a plurality of small perforations through which a wafer-supporting air flow may be applied;

means for selectively providing air under pressure to the back side of said plate and through said small perforations thereby to float a wafer over said plate;

selective actuable stop means in line with said air track means for stopping a wafer in alignment with said plate;

means for energizing said heater plate, prior to a bake cycle, to a temperature substantially above the temperature desired at which the resist is to be baked; and means for energizing said air track and said air pressure providing means to propel a wafer on said track into said heating station and into alignment with said plate against said stop means and thereafter dropping the pressure of the air flow through said small perforations to lower said wafer into direct contact with said plate for a preselectable time during which a predetermining heating impulse is provided through the wafer to resist on its upper surface, the plate being cooled as the wafer is heated, the pressure being then resumed to lift the wafer and effectively terminate the baking.

* * * * *